(12) United States Patent
Bothra et al.

(10) Patent No.: US 6,214,734 B1
(45) Date of Patent: Apr. 10, 2001

(54) METHOD OF USING FILMS HAVING OPTIMIZED OPTICAL PROPERTIES FOR CHEMICAL MECHANICAL POLISHING ENDPOINT DETECTION

(75) Inventors: Subhas Bothra; Milind G. Weling, both of San Jose, CA (US)

(73) Assignee: VLSI Technology, Inc., San Jose, CA (US)

( * ) Notice: Subject to any disclaimer, the term of this patent is extended or adjusted under 35 U.S.C. 154(b) by 0 days.

(21) Appl. No.: 09/197,377

(22) Filed: Nov. 20, 1998

(51) Int. Cl.$^7$ ...................... H01L 21/302; H01L 21/461
(52) U.S. Cl. .................. 438/692; 438/16; 438/959
(58) Field of Search ........................... 438/692, 690, 438/691, 693, 959, 14, 16

(56) References Cited

U.S. PATENT DOCUMENTS

| | | | |
|---|---|---|---|
| 5,731,239 | * 3/1998 | Wong et al. | 438/296 |
| 5,795,495 | * 8/1998 | Meikle | 438/693 |
| 5,835,226 | * 11/1998 | Berman et al. | 438/693 |
| 5,910,022 | * 6/1999 | Weling | 438/690 |
| 6,013,574 | * 1/2000 | Hause et al. | 438/622 |

* cited by examiner

Primary Examiner—Mary Wilczewski

(74) Attorney, Agent, or Firm—Wagner, Murabito & Hao LLP

(57) ABSTRACT

A method of using films having optimized optical properties for chemical mechanical polishing (CMP) endpoint detection. Specifically, one embodiment of the present invention includes a method for improving chemical mechanical polishing endpoint detection. The method comprises the step of depositing a dielectric layer over a reflectance stop layer. The reflectance stop layer is disposed above a component that is disposed on a semiconductor wafer. During a determination of the thickness of the dielectric layer using a reflected signal of light, the reflectance stop layer substantially reduces any light from reflecting off of the component. Therefore, the present invention provides a method and system that provides more accurate endpoint detection during a CMP process of semiconductor wafers. As a result of the present invention, an operator of a CMP machine knows precisely when to stop a CMP process of a semiconductor wafer. Furthermore, the present invention enables the operator of the CMP machine to know within a certain accuracy the film (e.g., dielectric layer) thickness remaining after the CMP process of the semiconductor wafer. Moreover, the present invention essentially eliminates excessive chemical mechanical polishing of the semiconductor wafer. As such, not as much dielectric material needs to be deposited on the wafer in order to compensate for excessive chemical mechanical polishing of the semiconductor wafer. Therefore, the present invention is able to reduce fabrication costs of semiconductor wafers.

26 Claims, 11 Drawing Sheets

METHOD OF USING FILMS HAVING OPTIMIZED OPTICAL PROPERTIES FOR CHEMICAL MECHANICAL POLISHING ENDPOINT DETECTION

TECHNICAL FIELD

The field of the present invention pertains to semiconductor fabrication processing. More particularly, the present invention relates to the field of endpoint detection during chemical mechanical polishing of semiconductor wafers.

BACKGROUND ART

Most of the power and usefulness of today's digital integrated circuit (IC) devices can be attributed to the increasing levels of integration. More and more components (resistors, diodes, transistors, and the like) are continually being integrated into the underlying chip, or IC. The starting material for typical ICs is very high purity silicon. The material is grown as a single crystal and takes the shape of a solid cylinder. This crystal is then sawed (like a loaf of bread) to produce wafers typically 10 to 30 cm in diameter and 250 microns thick.

The geometry of the features of the IC components are commonly defined photographically through a process known as photolithography. Very fine surface geometries can be reproduced accurately by this technique. The photolithography process is used to define component regions and build up components one layer on top of another. Complex ICs can often have many different built up layers, each layer having components, each layer having differing interconnections, and each layer stacked on top of the previous layer. The resulting topography of these complex IC's often resemble familiar terrestrial "mountain ranges," with many "hills" and "valleys" as the IC components are built up on the underlying surface of the silicon wafer.

In the photolithography process, a mask image, or pattern, defining the various components, is focused onto a photosensitive layer using incident light. The image is focused onto the surface using the optical means of the photolithography tool, and is imprinted into the photosensitive layer. To build ever smaller features, increasingly fine images must be focused onto the surface of the photosensitive layer, i.e. optical resolution must increase. As optical resolution increases, the depth of focus of the mask image correspondingly narrows. This is due to the narrow range in depth of focus imposed by the high numerical aperture lenses in the photolithography tool. This narrowing depth of focus is often the limiting factor in the degree of resolution obtainable, and thus, the smallest components obtainable using the photolithography tool. The extreme topography of complex ICs, the "hills" and "valleys," exaggerate the effects of decreasing depth of focus. Thus, in order to properly focus the mask image defining sub-micron geometries onto the photosensitive layer, a precisely flat surface is desired. The precisely flat (i.e., fully planarized) surface will allow for extremely small depths of focus, and in turn, allow the definition and subsequent fabrication of extremely small components.

Chemical mechanical polishing (CMP) is a preferred method of obtaining full planarization of a semiconductor wafer. It involves removing a sacrificial layer of dielectric material using mechanical contact between the wafer and a moving polishing pad saturated with slurry. Polishing flattens out height differences, since high areas of topography (hills) are removed faster than areas of low topography (valleys). Polishing is the only technique with the capability of smoothing out topography over millimeter scale planarization distances leading to maximum angles of much less than one degree after polishing.

FIG. 1 is a top view of a chemical mechanical polishing (CMP) machine 100 and FIG. 2 is a side view of CMP machine 100. CMP machine 100 is fed semiconductor wafers to be polished. CMP machine 100 picks up the wafers with an arm 101 and places them onto a rotating polishing pad 102. Polishing pad 102 is made of a resilient material and is textured, often with a plurality of predetermined grooves 103, to aid the polishing process. Polishing pad 102 rotates on a platen 104, or turn table located beneath polishing pad 102, at a predetermined speed. A wafer 105 is held in place on polishing pad 102 within a carrier ring 112 that is connected to a carrier film 106 of arm 101. The front surface of wafer 105 rests against polishing pad 102. The back surface of wafer 105 is against the lower surface of carrier film 106 of arm 101. As polishing pad 102 rotates, arm 101 rotates wafer 105 at a predetermined rate. Arm 101 forces wafer 105 into polishing pad 102 with a predetermined amount of down force. CMP machine 100 also includes a slurry dispense arm 107 extending across the radius of polishing pad 102, which dispenses a flow of slurry onto polishing pad 102.

The slurry is a mixture of deionized water and polishing agents designed to chemically aid the smooth and predictable planarization of wafer 105. The rotating action of both polishing pad 102 and wafer 105, in conjunction with the polishing action of the slurry, combine to planarize, or polish, wafer 105 at some nominal rate. This rate is referred to as the removal rate. A constant and predictable removal rate is important to the uniformity and throughput performance of the wafer fabrication process. The removal rate should be expedient, yet yield precisely planarized wafers, free from surface anomalies. If the removal rate is too slow, the number of planarized wafers produced in a given period of time decreases, hurting wafer throughput of the fabrication process. If the removal rate is too fast, the CMP planarization process will not be consistent across several wafers in a batch, thereby hurting the consistency of the fabrication process.

To aid in maintaining a stable removal rate, CMP machine 100 includes a conditioner assembly 120. Conditioner assembly 120 includes a conditioner arm 108, which extends across the radius of polishing pad 102. An end effector 109 is connected to conditioner arm 108. End effector 109 includes an abrasive conditioning disk 110 which is used to roughen the surface of polishing pad 102. Conditioning disk 110 is rotated by conditioner arm 108 and is translationally moved towards the center of the polishing pad 102 and away from the center of polishing pad 102, such that conditioning disk 110 covers the radius of polishing pad 102. In so doing, conditioning disk 110 covers the surface area of polishing pad 102, as polishing pad 102 rotates. A polishing pad having a roughened surface has an increased number of micro-pits and gouges in its surface from conditioner assembly 120 and therefore produces a faster removal rate via increased slurry transfer to the surface of wafer 105. Without conditioning, the surface of polishing pad 102 is smoothed during the polishing process and removal rate decreases dramatically. Conditioner assembly 120 re-roughens the surface of polishing pad 102, thereby improving the transport of slurry and improving the removal rate.

As described above, the CMP process uses an abrasive slurry on a polishing pad. The polishing action of the slurry is comprised of an abrasive frictional component and a chemical component. The abrasive frictional component is due to the friction between the surface of the polishing pad, the surface of the wafer, and abrasive particles suspended in the slurry. The chemical component is due to the presence in the slurry of polishing agents which chemically interact with the material of the dielectric layer of wafer 105. The chemical component of the slurry is used to soften the surface of the dielectric layer to be polished, while the frictional component removes material from the surface of wafer 105.

Referring still to FIGS. 1 and 2, the polishing action of the slurry determines the removal rate and removal rate uniformity, and thus, the effectiveness of the CMP process. As slurry is "consumed" in the polishing process, the transport of fresh slurry to the surface of wafer 105 and the removal of polishing by-products away from the surface of wafer 105 becomes very important in maintaining the removal rate. Slurry transport is facilitated by the texture of the surface of polishing pad 102. This texture is comprised of both predefined grooves 103 and micro-pits that are manufactured into the surface of polishing pad 102 and the inherently rough surface of the material from which polishing pad 102 is made.

The slurry is transported by grooves 103 and micro-pits of polishing pad 102 under the edges of wafer 105 as both polishing pad 102 and wafer 105 rotate. Consumed slurry and polishing by-products, in a similar manner, are also transported by grooves 103 and micro-pits of polishing pad 102 away from the surface of wafer 105. As the polishing process continues, fresh slurry is continually dispensed onto polishing pad 102 from slurry dispense arm 107. The polishing process continues until wafer 105 is sufficiently planarized and removed from polishing pad 102.

There are several conventional prior art techniques to determine when to remove wafer 105 from polishing pad 102 of CMP machine 100. One such technique is referred to as endpoint detection, which is a way of determining when to stop the CMP process of a semiconductor wafer. One type of prior art endpoint detection technique, which is well known by those of ordinary skill in the art, involves using reflected incident light to determine the thickness of a film (e.g., oxide) on wafer 105 during the CMP process. Once the film achieves a desired thickness, the CMP process is discontinued.

Specifically, this prior art endpoint detection technique typically includes a transparent window slit 114 of FIG. 1 that is located within polishing pad 102 and enables incident light to pass through it. Furthermore, window slit 114 is positioned within polishing pad 102 such that wafer 105 passes over it every time polishing pad 102 makes a complete rotation. In other words, every time polishing pad 102 rotates during the CMP process, window slit 114 passes underneath wafer 105. As wafer 105 passes over window slit 114, incident light shines through window slit 114 and reflects off of different surfaces within wafer 105. As such, a single wavelength or different wavelengths of reflected incident light are then used to determine the thickness of a film on wafer 105 during the CMP process. As mentioned above, once the film achieves a desired thickness, the CMP process of wafer 105 is discontinued.

There are disadvantages associated with the prior art endpoint detection technique described above. One of the main disadvantages is that it does not provide accurate endpoint detection during a CMP process of semiconductor wafers. One of the factors that causes the prior art light reflection endpoint detection technique to be inaccurate is referred to as "pattern density effects." For example, FIG. 3 shows incident light rays 302–308 reflecting off of different surfaces within a side sectional view of semiconductor wafer 105. Since incident light rays 302–308 each reflect off of different surfaces at different depths within wafer 105, a subsequent film thickness determination of any particular layer using reflected incident light rays 302–308 is difficult. This is referred to as pattern density effects. As such, determining when the desired endpoint has been reached during the CMP process of wafer 105 becomes more difficult and therefore results in less control of the film removal process.

Another factor that causes the prior art light reflection endpoint detection technique to provide inaccurate endpoint detection during a CMP process of semiconductor wafers is that it is difficult to precisely align window slit 114 of FIG. 1 with a particular desirable region of semiconductor wafer 105. One of the reasons for this difficulty is that polishing pad 102 is rotating at the same time arm 101 rotates wafer 105 at a predetermined rate. As a result of this alignment difficulty, the reflected incident light rays 302–308 of FIG. 3 also represent what would be typically received from wafer 105 during a film thickness determination of any particular layer. As such, the received reflected incident light rays 302–308 make it difficult to determine the film thickness of any particular layer thereby reducing the accuracy at which the desired endpoint can be detected. Therefore, the prior art endpoint detection technique described above is undesirable because it does not provide accurate endpoint detection during a CMP process of semiconductor wafers.

Accordingly, a need exists for a method and system that provides more accurate endpoint detection during a CMP process of semiconductor wafers.

DISCLOSURE OF THE INVENTION

The present invention provides a method and system that provides more accurate endpoint detection during a chemical mechanical polishing (CMP) process of semiconductor wafers. As a result of the present invention, an operator of a CMP machine knows precisely when to stop a CMP process of a semiconductor wafer. Furthermore, the present invention enables the operator of the CMP machine to know within a certain accuracy the film (e.g., dielectric layer) thickness remaining after the CMP process of the semiconductor wafer. Moreover, the present invention essentially eliminates excessive chemical mechanical polishing of the semiconductor wafer. As such, not as much dielectric material needs to be deposited on the wafer in order to compensate for excessive chemical mechanical polishing of the semiconductor wafer. Therefore, the present invention is able to reduce fabrication costs of semiconductor wafers.

Specifically, one embodiment of the present invention includes a method for improving chemical mechanical polishing endpoint detection. The method comprises the step of depositing a dielectric layer over a reflectance stop layer. The reflectance stop layer is disposed above a component that is disposed on a semiconductor wafer. During a determination of the thickness of the dielectric layer using a reflected signal of light, the reflectance stop layer substantially reduces any light from reflecting off of the component.

Another embodiment of the present invention also includes a method for improving chemical mechanical polishing endpoint detection. The method comprises the step of depositing a reflectance stop layer above a component that is disposed on a semiconductor wafer. The reflectance stop layer substantially reduces any light from reflecting off of the component. The method also includes the step of depositing a dielectric layer over the reflectance stop layer and the component. Another step of the method includes removing material from the dielectric layer disposed above the semiconductor wafer using a chemical mechanical polishing process. Moreover, the method further includes the step of determining the thickness of the dielectric layer disposed above the semiconductor wafer using a reflected signal of light. In response to the dielectric layer substantially achieving a desired thickness, the method includes the step of stopping the chemical mechanical polishing process of the semiconductor wafer.

In still another embodiment, the present invention comprises the step of depositing a first dielectric layer above a reflectance stop layer. The reflectance stop layer is disposed above a second dielectric layer. The second dielectric layer is disposed over a component that is disposed on a semiconductor wafer. During a determination of the thickness of said second dielectric layer above said component using a reflected signal of light, the reflectance stop layer substantially reduces any light from reflecting off of other surfaces except said component.

Another embodiment of the present invention comprises the step of depositing a first dielectric layer over a component disposed on a semiconductor wafer. The method includes the step of depositing a reflectance stop layer above the first dielectric layer. Furthermore, the method includes the step of depositing a second dielectric layer above the reflectance stop layer. Another step of the method includes removing material from the second dielectric layer and the reflectance stop layer disposed above the semiconductor wafer using a chemical mechanical polishing process. The second dielectric layer and the reflectance stop layer subsequently are substantially removed from above the component. Moreover, the method further includes the step of determining the thickness of the first dielectric layer above the component using a reflected signal of light. The reflectance stop layer that remains substantially reduces any light from reflecting off of other surfaces except the component. In response to the first dielectric layer substantially achieving a desired thickness above the component, the method includes the step of stopping the chemical mechanical polishing process of the semiconductor wafer.

These and other advantages of the present invention will no doubt become obvious to those of ordinary skill in the art after having read the following detailed description of the preferred embodiments which are illustrated in the drawing figures.

BRIEF DESCRIPTION OF THE DRAWINGS

The accompanying drawings, which are incorporated in and form a part of this specification, illustrate embodiments of the invention and, together with the description, serve to explain the principles of the invention.

Prior Art

Prior Art

Prior Art

Figure 1:
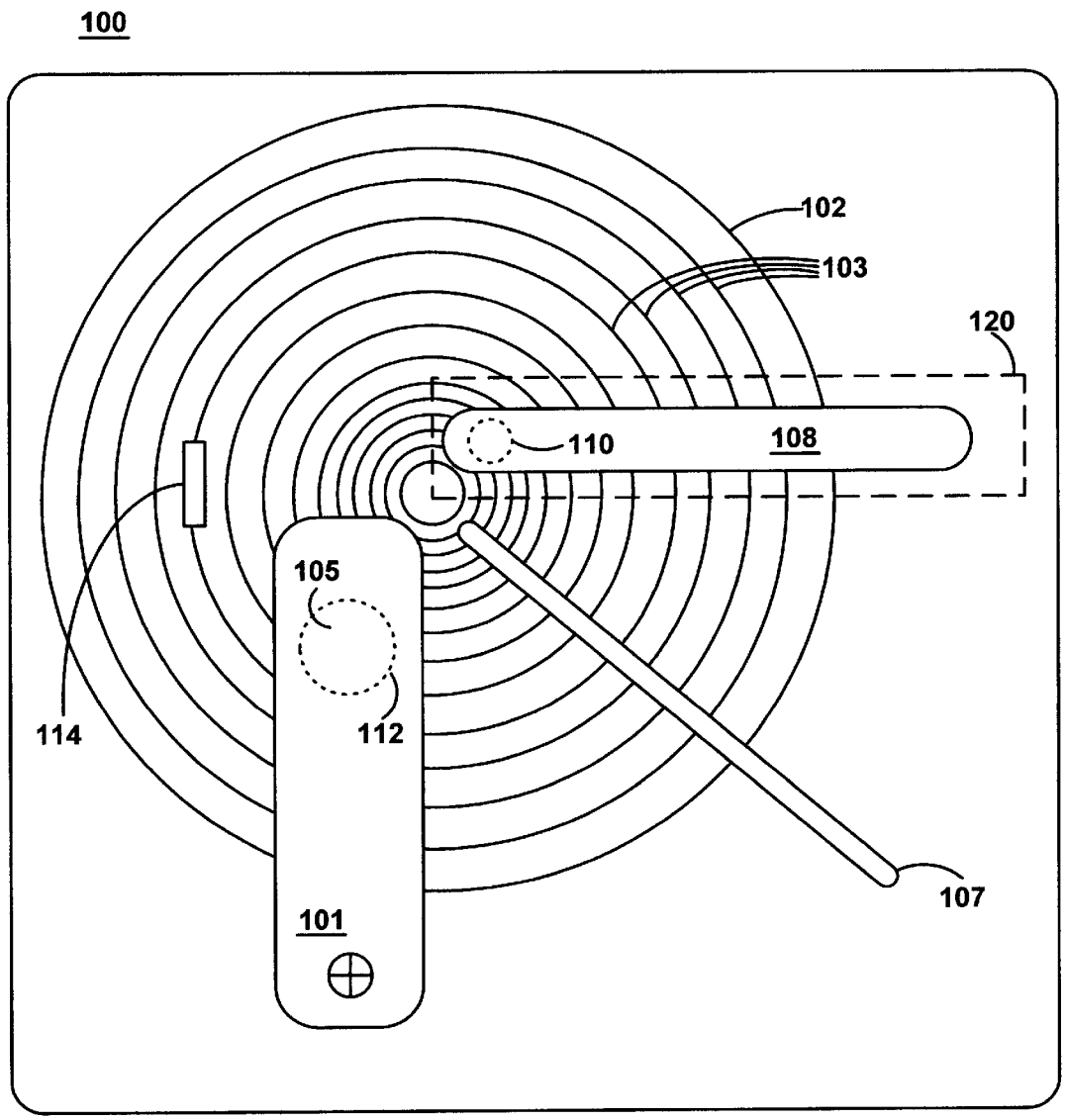
FIG. 1 is a top view of a prior art chemical mechanical polishing machine.
Figure 2:
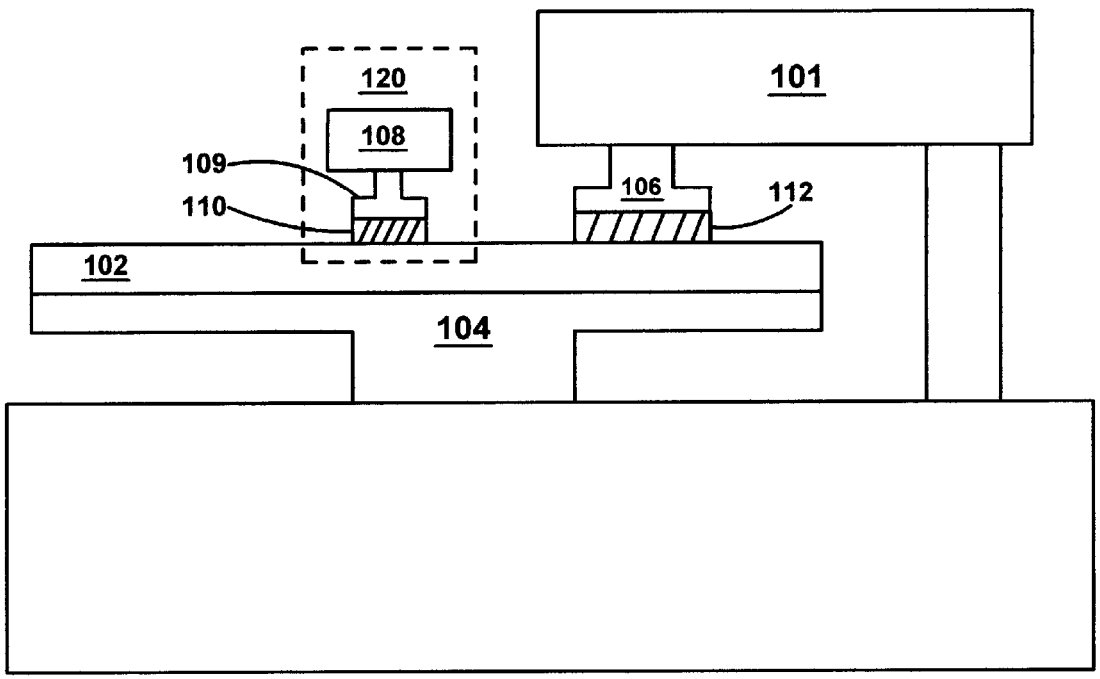
FIG. 2 is a side view of the prior art chemical mechanical polishing machine of FIG. 1.
Figure 3:
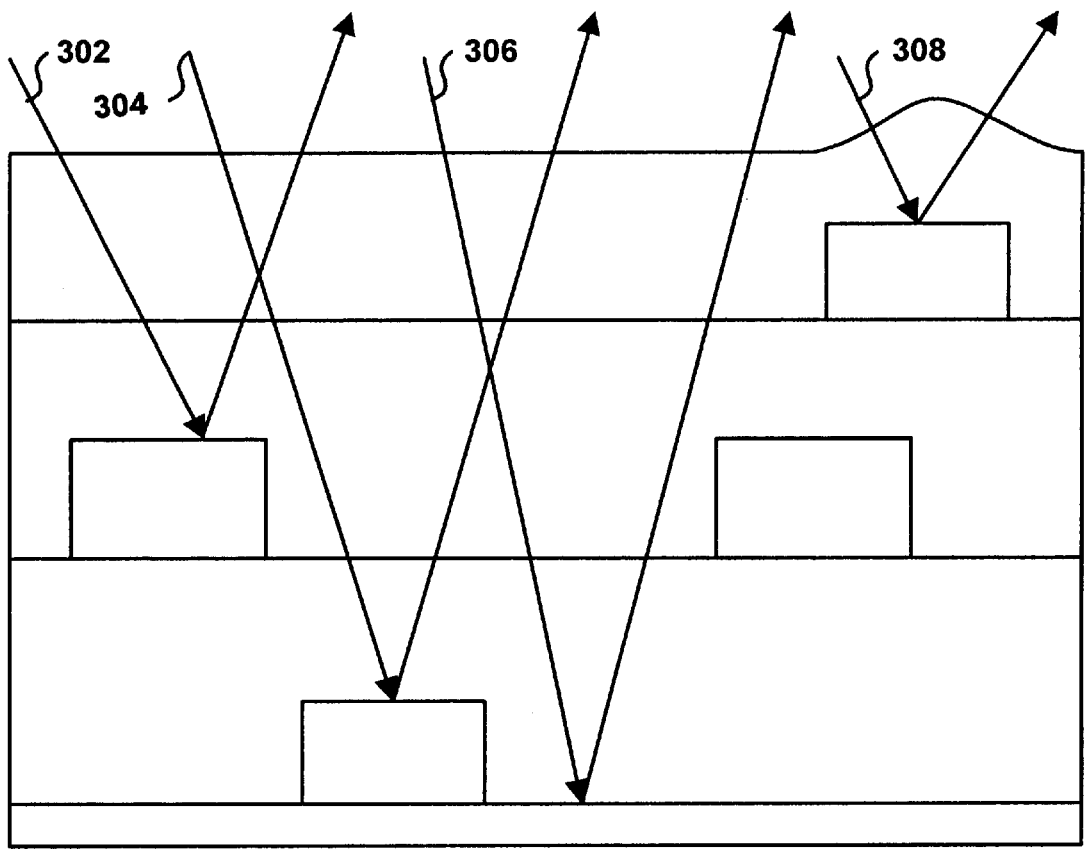
FIG. 3 shows incident light reflecting off of a side sectional view of a semiconductor wafer in order to determine the thickness of its films during a chemical mechanical polishing process.

The drawings referred to in this description should be understood as not being drawn to scale except if specifically noted.

BEST MODE FOR CARRYING OUT THE INVENTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the appended claims. Furthermore, in the following detail description of the present invention, numerous specific details are set forth in order to provide a thorough understanding of the present invention. However, it will be obvious to one of ordinary skill in the art that the present invention may be practiced without these specific details. In other instances, well known methods, procedures, components, and circuits have not been described in detail as not to unnecessarily obscure aspects of the present invention.

Chemical mechanical polishing (CMP) is a preferred method of obtaining full planarization of a semiconductor wafer containing devices for fabrication processing. The CMP process involves removing all, or a portion of, a layer of dielectric material using mechanical contact between the wafer and a moving polishing pad saturated with a polishing slurry. Polishing through the CMP process flattens out height differences, since high areas of topography (hills) are removed faster than areas of low topography (valleys). The CMP process has the capability of smoothing out topography over millimeter scale planarization distances, leading to maximum angles of much less than one degree after polishing.

Furthermore, chemical mechanical polishing is widely accepted as a preferred intermediary process during fabrication of complex integrated circuits (ICs) having multiple layers. For instance, complex ICs often have many different built up layers, each layer having components, each layer having differing interconnections, and each layer fabricated on top of the previous layer. One of the techniques for fabricating the individual layers of complex ICs is to encase the metal components of each layer within dielectric material, commonly referred to as an inter-metal dielectric layer. The purpose of the inter-metal dielectric layer is to electrically isolate the metal components of one layer from the metal components of previous and/or subsequent layers. Once an inter-metal dielectric layer is fabricated, another layer of components is subsequently fabricated on top of it. But before the subsequent layer of components are fabricated, it is important to first planarize the dielectric surface onto which they will be fabricated in preparation for the photolithography process, previously described above. Typically, chemical mechanical polishing is the preferred intermediary process used to planarize the dielectric surface before fabrication of a subsequent layer of components.

It is appreciated that there are different techniques for determining when to stop a CMP process of a semiconductor wafer, which is commonly referred to as endpoint detection. The present invention provides a method and system that provides more accurate endpoint detection during a chemical mechanical polishing process of semiconductor wafers. One embodiment of the present invention includes the implementation of the endpoint detection technique of using reflected incident light to determine the thickness of a film (e.g., oxide) on a semiconductor wafer during a CMP process, as described above. As a result of the present invention, an operator of a CMP machine knows precisely when to stop a CMP process of a semiconductor wafer. Furthermore, the present invention enables the operator of the CMP machine to know within a certain accuracy the film (e.g., dielectric layer) thickness remaining after the CMP process of the semiconductor wafer. Moreover, the present invention essentially eliminates excessive chemical mechanical polishing of the semiconductor wafer. As such, not as much dielectric material needs to be deposited on the wafer in order to compensate for excessive chemical mechanical polishing of the semiconductor wafer. Therefore, the present invention is able to reduce fabrication costs of semiconductor wafers. The CMP endpoint detection method of the present invention and its benefits are described in greater detail below.

Figure 4A:
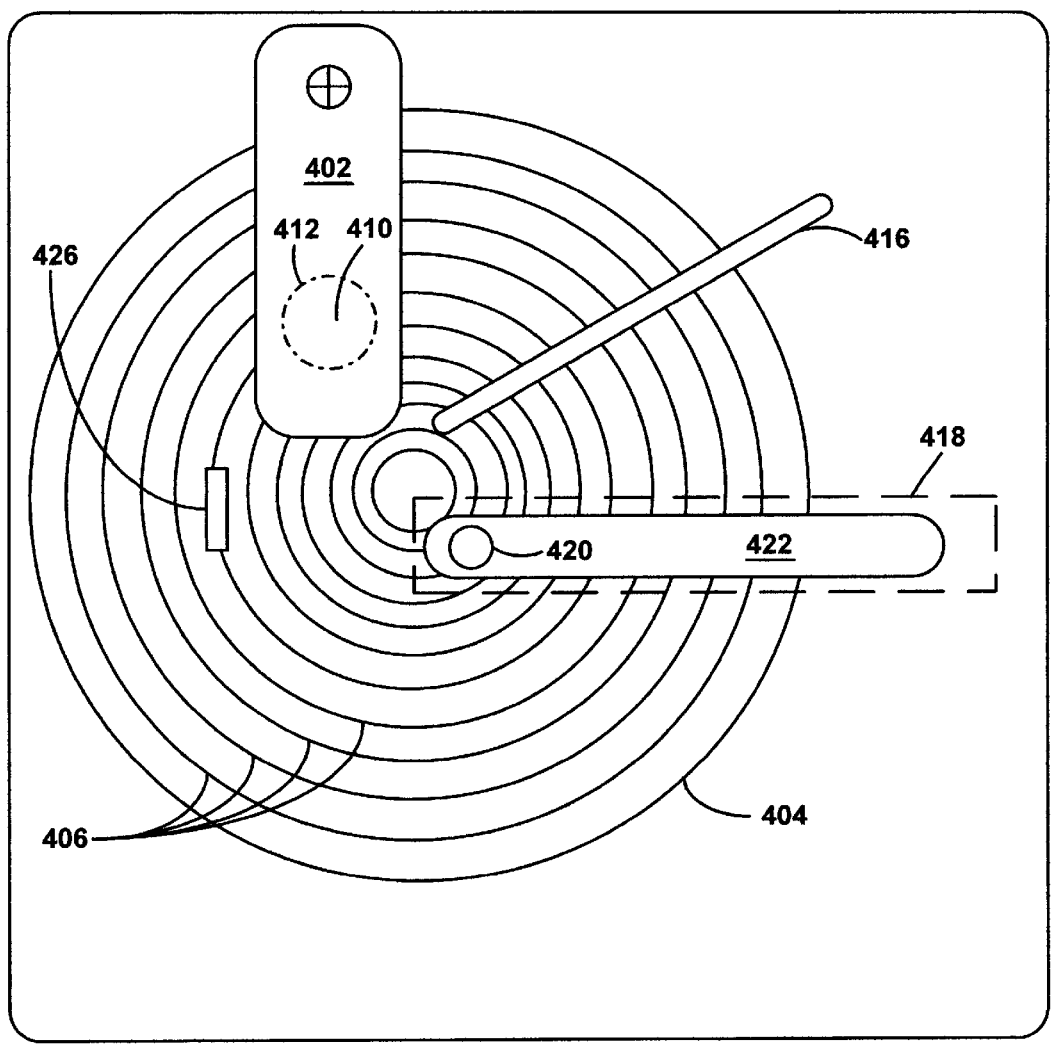
FIG. 4A is a top view of a chemical mechanical polishing machine in accordance with one embodiment of the present invention.
Figure 4B:
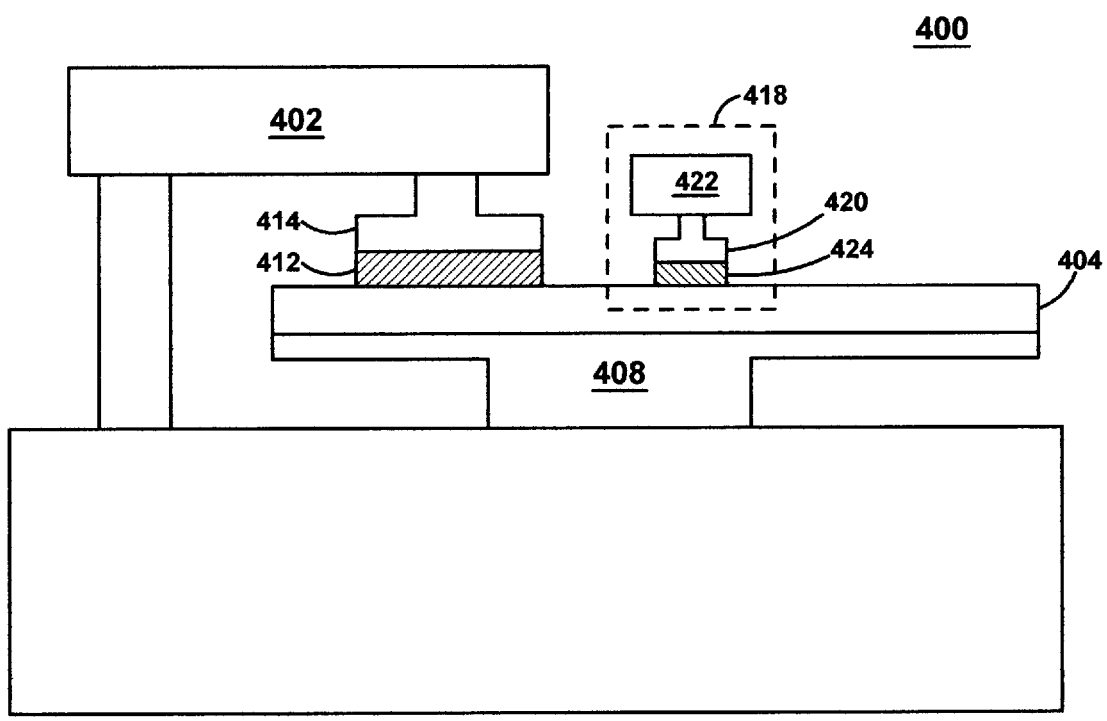
FIG. 4B is a side view of the chemical mechanical polishing machine of FIG. 4A.

FIG. 4A shows a top view of a chemical mechanical polishing (CMP) machine 400 in accordance with one embodiment of the present invention utilized for chemical mechanical polishing of semiconductor wafers. FIG. 4B shows a side view of CMP machine 400. CMP machine 400 picks up a semiconductor wafer 410, which was fabricated in accordance with an embodiment of the present invention, with an arm 402 and places it onto the rotating polishing pad 404. Polishing pad 404 is made of a resilient material and is textured typically with a plurality of grooves 406 to aid the polishing process. Polishing pad 404 of CMP machine 400 rotates at a predetermined speed on a platen 408, or turn table located beneath polishing pad 404. Arm 402 forces wafer 410 into polishing pad 404 with a predetermined amount of down force. Wafer 410 is held in place on the polishing pad 404 by a carrier ring 412 and a carrier film 414 of arm 402. The front surface of wafer 410 rests against the polishing pad 404 while the back surface of wafer 410 is against the lower surface of carrier film 414 of arm 402. As polishing pad 404 rotates, arm 402 also rotates wafer 410 at a predetermined rate.

CMP machine 400 also includes a slurry dispense arm 416 extending across the radius of polishing pad 404. Slurry dispense arm 416 dispenses a flow of slurry onto polishing pad 404. CMP machine 400 further includes a conditioner assembly 418 which consists of an end effector 420 and a conditioner arm 422 that extends across the radius of polishing pad 404. End effector 420 is connected to conditioner arm 422 and includes an abrasive disk 424 that is used to roughen the surface of the polishing pad 404, in the manner described above. The dispensed slurry is transported by grooves 406 and micro-pits of polishing pad 404 under the edges of wafer 410 as both polishing pad 404 and wafer 404 rotate. Consumed slurry and polishing by-products, in a similar manner, are also transported by grooves 406 and micro-pits of polishing pad 404 away from the surface of wafer 410. As the polishing process continues, fresh slurry is continually dispensed onto polishing pad 404 from slurry dispense arm 416. The polishing process of wafer 410 continues until its desired endpoint is detected. Once the endpoint is detected, the CMP process of wafer 410 is discontinued.

The endpoint detection technique implemented within the present embodiment involves using reflected incident light to determine the thickness of a film (e.g., dielectric) on wafer 410 during the CMP process. Once the film achieves a desired thickness, the CMP process is suspended. This endpoint detection technique is well known by those of ordinary skill in the art. Specifically, the endpoint detection technique implemented within the present embodiment includes a transparent window slit 426 of FIG. 4A that is located within polishing pad 404 and enables incident light to pass through it. Furthermore, window slit 426 is positioned within polishing pad 404 such that wafer 410 passes over it every time polishing pad 404 makes a complete rotation. That is, every time polishing pad 404 rotates during the CMP process, window slit 426 passes underneath wafer 410. As wafer 410 passes over window slit 426, incident light shines through window slit 426 and reflects off of different surfaces within wafer 410. As such, a single wavelength or different wavelengths of reflected incident light are then used to determine the thickness of the film on wafer 410 during the CMP process. Once the film achieves a desired thickness, the CMP process of wafer 410 is ended.

DETAILED DESCRIPTION OF THE STRUCTURE OF THE PRESENT INVENTION

Figure 5A:
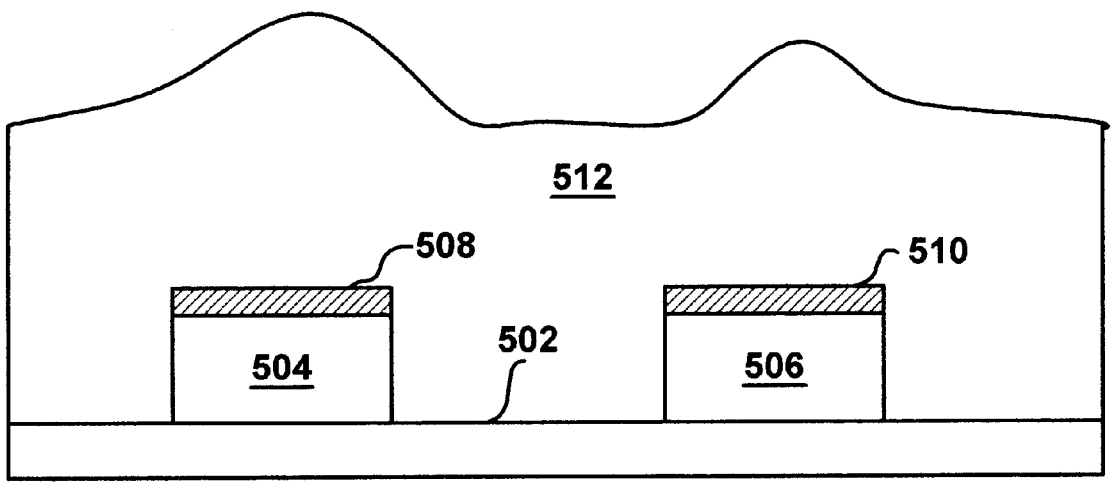
FIG. 5A is a side sectional view of a semiconductor wafer having a reflectance stop layer deposited above metal components in accordance with one embodiment of the present invention.

With reference now to FIG. 5A, which is a side sectional view of semiconductor wafer 410 having reflectance stop layers 508 and 510 located above components 504 and 506, respectively, in accordance with one embodiment of the present invention. Furthermore, a dielectric layer 512 is deposited over reflectance stop layers 508 and 510, components 504 and 506, and substrate 502 of semiconductor wafer 410. It should be appreciated that other embodiments of dielectric layer 512, in accordance with the present embodiment, include any type of non-conductive material (e.g., oxide, polymer, and the like). Furthermore, it should also be appreciated that embodiments of reflectance stop layers 508 and 510, in accordance with the present embodiment, include silicon oxy-nitride, amorphous silicon, and the like. Moreover, it should also be appreciated that embodiments of components 504 and 506, in accordance with the present embodiment, include any type of conductive material (e.g., aluminum, copper, silver, gold, and the like). After fabrication of semiconductor wafer 410, dielectric layer 512 is ready to be planarized to a desired thickness using CMP machine 400 of FIGS. 4A and 4B and the endpoint detection technique described above.

Figure 5B:
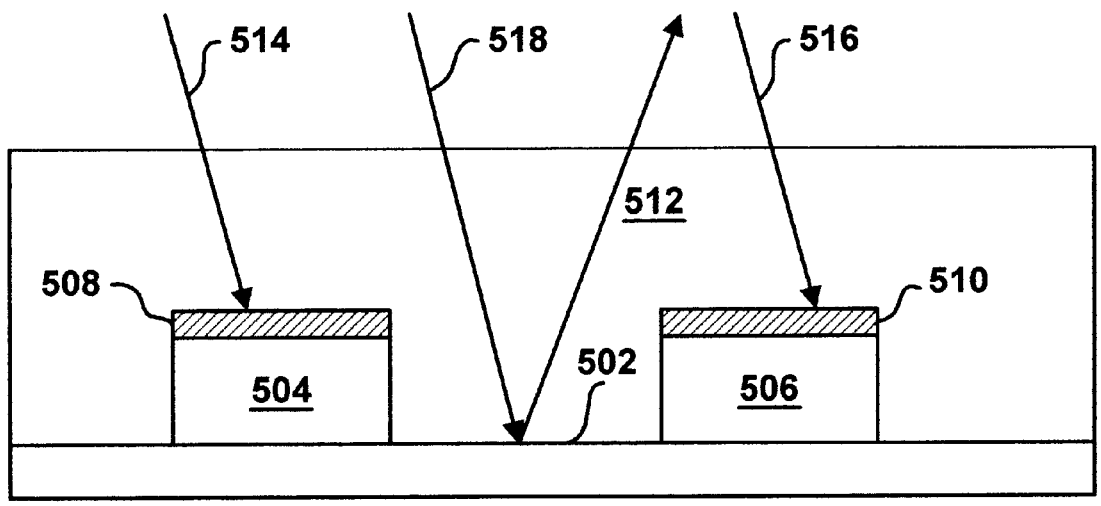
FIG. 5B shows incident light reflecting off of the semiconductor wafer of FIG. 5A in order to determine the thickness of its films during a chemical mechanical polishing process.

Referring now to FIG. 5B, which shows a determination of the thickness of dielectric layer 512 using incident light (e.g., incident light rays 514–518) during a CMP process of semiconductor wafer 410. Within the present embodiment, it is appreciated that an amount of dielectric layer 512 has been removed during the CMP process. It should be further appreciated that the main purpose of reflectance stop layers 508 and 510, within the present embodiment, is to suppress incident light from reflecting off of underlying components 504 and 508. As such, reflected incident light is substantially obtained from substrate 502. As a result, any changes in the reflectance of incident light during the CMP process is merely attributed to a change in the thickness of dielectric layer 512. Therefore, by providing a more accurate measurement of the thickness of dielectric layer 512, the present embodiment provides more accurate endpoint detection during the CMP process.

Specifically, as CMP machine 400 polishes dielectric layer 512 of wafer 410, as described above, transparent window slit 426 passes underneath wafer 410. As such, incident light rays 514–518 pass through window slit 426 and shine on wafer 410 as shown in FIG. 5B. As a result, incident light rays 514 and 516 pass through dielectric layer 512 and are subsequently absorbed by reflectance stop layers 504 and 508, respectively. However, incident light ray 518 passes through dielectric layer 512, reflects off of substrate 502, and subsequently passes through dielectric layer 512 to eventually be used to determine the thickness of dielectric layer 512. Therefore, the present embodiment limits what incident light rays 514–518 reflect off of within wafer 410.

It should be appreciated that the if reflectance stop layers 508 and 510 are deposited too thin above components 504 and 506, they will not sufficiently suppress the reflection of incident light in the course of a determination of the thickness of dielectric layer 512 during a CMP process. As such, it is important that a proper thickness of reflectance stop layers 508 and 510 are deposited above components 504 and 506, within the present embodiment. As such, the following examples illustrates this point. Given the wavelength of incident light to be used to determine the thickness of dielectric layer 512 is 450 nanometers (nm). Furthermore, reflectance stop layers 508 and 510 are an amorphous silicon having an absorption coefficient of about $4\times10^5$/cm. Therefore, if 500 angstroms of reflectance stop layers 508 and 510 are deposited above components 504 and 506, reflectance stop layers 508 and 510 each provide 87% absorption of that particular wavelength of incident light. Moreover, if 1000 angstroms of reflectance stop layers 508 and 510 are deposited above components 504 and 506, reflectance stop layers 508 and 510 each provide 98% absorption of that particular wavelength of incident light. Within the present embodiment, it should be appreciated that reflectance stop layers 508 and 510 are not limited to these specific examples of thickness.

Figure 6A:
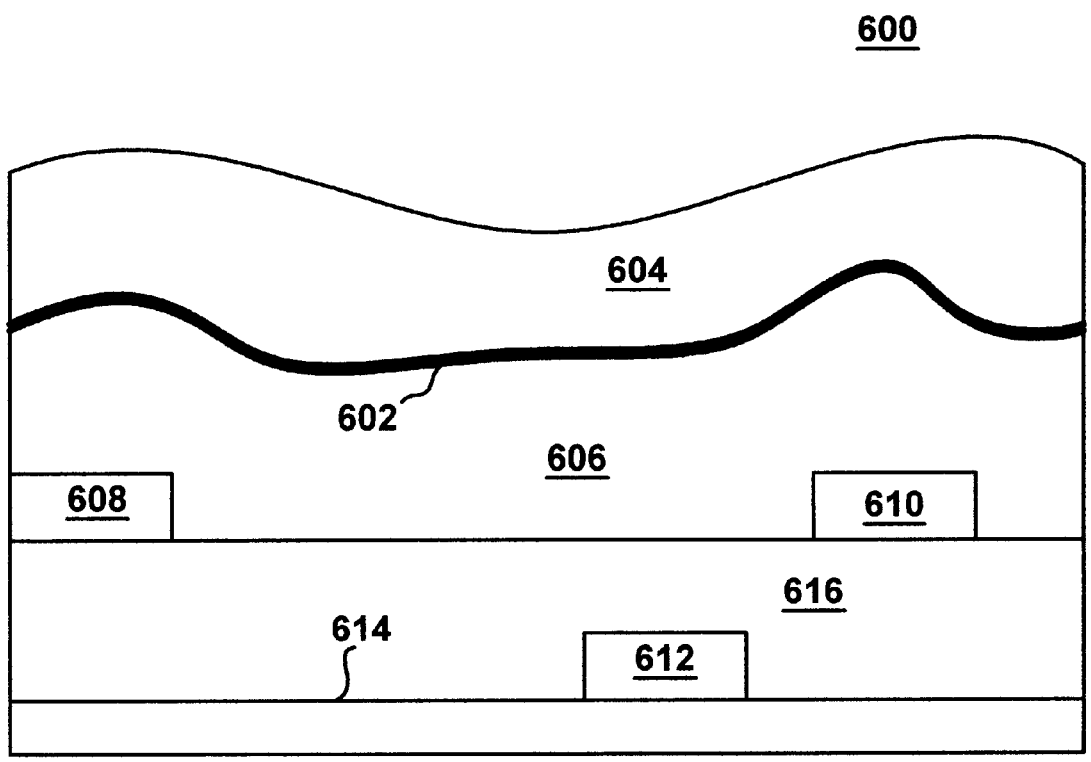
FIG. 6A is a side sectional view of a semiconductor wafer having a reflectance stop layer deposited between two dielectric layers in accordance with one embodiment of the present invention.

With reference now to FIG. 6A, which is a side sectional view of a semiconductor wafer 600 which is an alternate embodiment of the present invention. Specifically, semiconductor wafer 600 includes a component 612 which is disposed on a substrate 614. A dielectric layer 616 is deposited over component 612 and substrate 614. Furthermore, components 608 and 610 are disposed on dielectric layer 616 of semiconductor wafer 600. A dielectric layer 606 is deposited over dielectric layer 616 and components 608 and 610. Moreover, semiconductor includes a reflectance stop layer 602 which is deposited above dielectric layer 606. Additionally, a dielectric layer 604 is deposited above reflectance stop layer 602 of wafer 600. It should be appreciated that other embodiments of dielectric layers 604, 606, and 616, in accordance with the present embodiment, include any type of non-conductive material (e.g., oxide, polymer, and the like). It should further be appreciated that embodiments of reflectance stop layer 602, in accordance with the present embodiment, include silicon oxy-nitride, amorphous silicon, and the like. Additionally, it should also be appreciated that embodiments of components 608–612, in accordance with the present embodiment, include any type of conductive material (e.g., aluminum, copper, silver, gold, and the like). After fabrication of semiconductor wafer 600, dielectric layers 604 and 606 are ready to be planarized to a desired thickness using CMP machine 400 of FIGS. 4A and 4B and the endpoint detection technique described above.

Figure 6B:
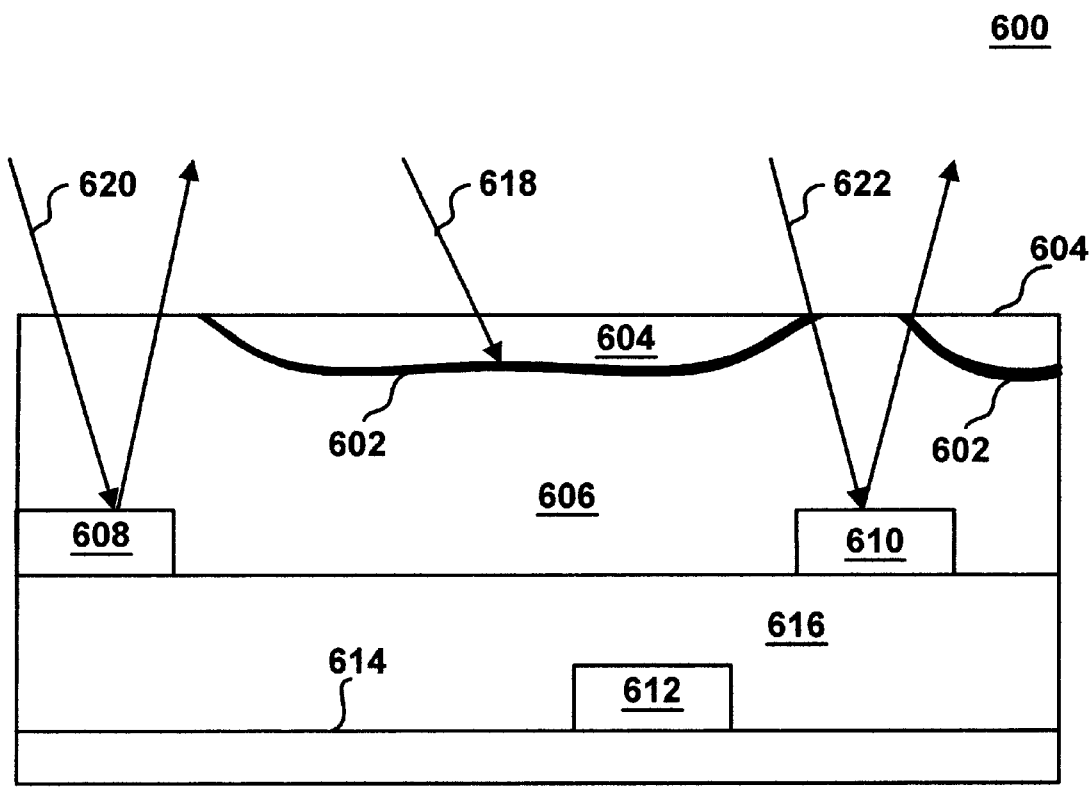
FIG. 6B shows incident light reflecting off of the semiconductor wafer of FIG. 6A in order to determine the thickness of its films during a chemical mechanical polishing process.

Referring now to FIG. 6B, which shows a determination of the thickness of dielectric layer 606 above components 608 and 610 using incident light (e.g., incident light rays 618–622) during a CMP process of semiconductor wafer 600. Within the present embodiment, it is appreciated that a substantial amount of dielectric layer 604 has been removed during the CMP process. Furthermore, reflectance stop layer 602 has been preferentially removed from above components 608 and 610 during the CMP process since high areas of topography (hills) are removed faster than areas of low topography (valleys). As such, the remaining portions of reflectance stop layer 602 within the present embodiment act as absorption layers that block incident light reflection from underlying component 612 and substrate 614. Thus, reflected incident light is substantially obtained from components 608 and 610. As a result, any changes in the reflectance of incident light during the CMP process is merely attributed to a change in the thickness of dielectric layer 606 above components 608 and 610. Therefore, by providing a more accurate measurement of the thickness of dielectric layer 606 above components 608 and 610, the present embodiment provides more accurate endpoint detection during the CMP process. It should be appreciated that endpoint detection of the present embodiment is set to start determining the thickness of dielectric layer 606 once reflectance stop layer 602 has been polished away from above components 608 and 610 as shown in FIG. 6B.

Specifically, as CMP machine 400 polishes various layers of semiconductor wafer 600 as described above, transparent window slit 426 passes underneath wafer 600. As such, incident light rays 618–622 pass through window slit 426 and shine on wafer 600 as shown in FIG. 6B. As a result, incident light ray 618 passes through dielectric layer 604 and is subsequently absorbed by reflectance stop layer 602. However, incident light rays 620 and 622 pass through dielectric layer 606, reflect off of components 608 and 610, respectively, and subsequently pass through dielectric layer 606. Eventually, reflected incident light rays 620 and 622 are used to determine the thickness of dielectric layer 606 above components 608 and 610. Therefore, the present embodiment limits what incident light rays 618–622 reflect off of within wafer 600.

Within the present embodiment, it should be appreciated that the if reflectance stop layer 602 is deposited too thin above dielectric layer 606, it will not sufficiently suppress the reflection of incident light. As a result, the determination of the thickness of dielectric layer 606 above components 608 and 610 will not be accurate during a CMP process. Therefore, it is important that a proper thickness of reflectance stop layer 602 is deposited above dielectric layer 606, within the present embodiment. The examples previously described above with reference to FIGS. 5A and 5B illustrate this point.

DETAILED DESCRIPTION OF METHODS OF THE PRESENT INVENTION

Figure 7:
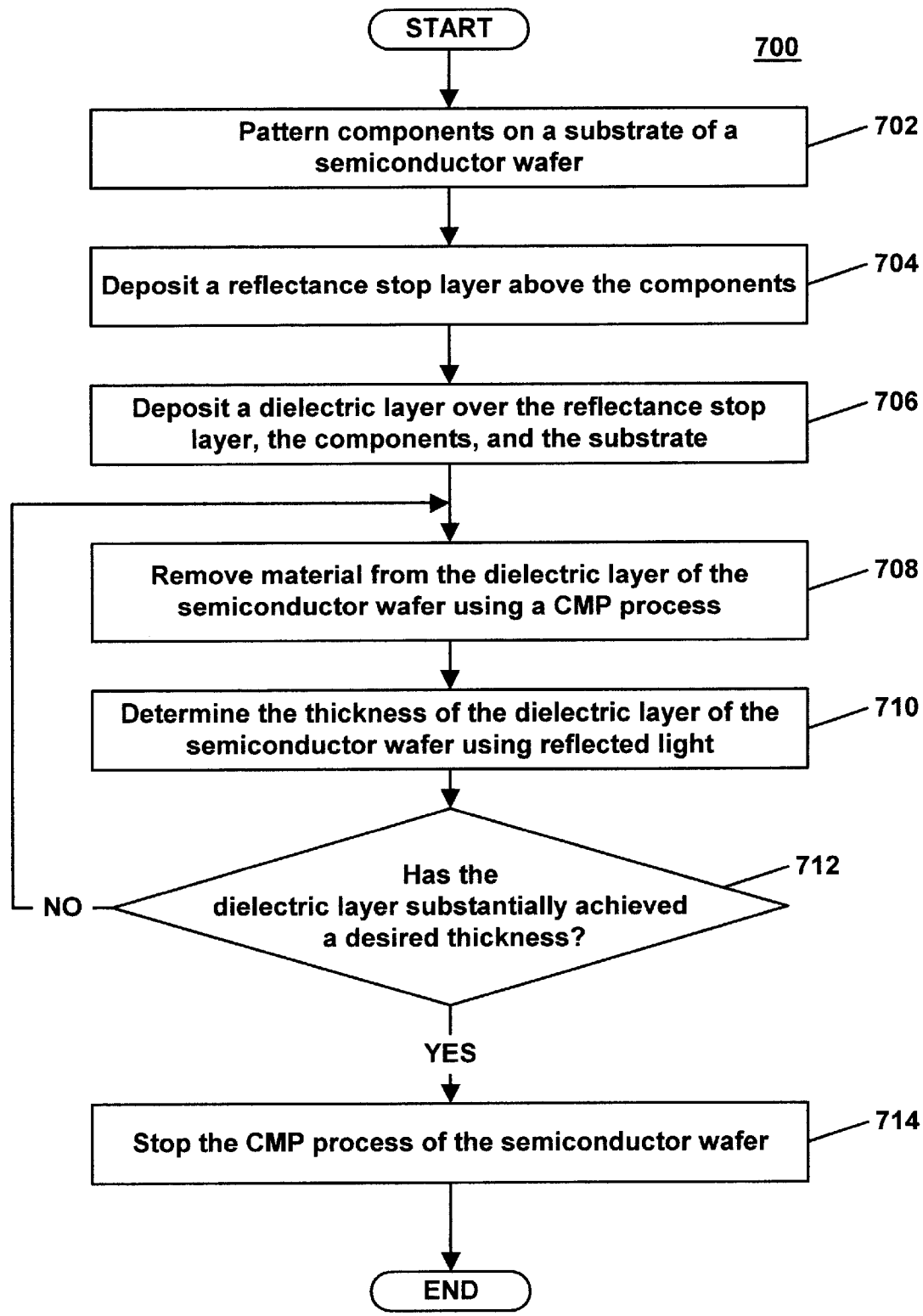
FIG. 7 is a flowchart of a method in accordance with one embodiment of the present invention for improving chemical mechanical polishing endpoint detection during planarization of semiconductor wafers.

With reference next to FIG. 7, a flowchart 700 in accordance with one embodiment of the present invention for providing more accurate endpoint detection during chemical mechanical polishing of semiconductor wafers. In step 702, in one embodiment of the present invention, components 504 and 506 of FIGS. 5A and 5B are patterned on substrate 502 of semiconductor wafer 410. Within the present embodiment, it should be appreciated that during step 702, components 504 and 506 can be patterned on surfaces other than substrate 502 (e.g., dielectric layer).

During step 704, within the present embodiment, reflectance stop layers 508 and 510 are deposited and patterned above components 504 and 506, respectively, of semiconductor wafer 410.

Within step 706 of FIG. 7, dielectric layer 512 is deposited over reflectance stop layers 508 and 510, components 504 and 506, and substrate 502 of semiconductor wafer 410.

In step 708, in the present embodiment, CMP machine 400 of FIGS. 4A and 4B removes material from dielectric layer 512 by performing a chemical mechanical polishing process on semiconductor wafer 410, as described above.

Within step 710 of FIG. 7, the present embodiment determines the thickness of dielectric layer 512 of semiconductor wafer 410 using incident light during the CMP process, as described above.

During step 712, the present embodiment determines whether dielectric layer 512 of semiconductor wafer 410 has substantially achieved a desired thickness. If dielectric layer 512 of semiconductor wafer 410 has not substantially achieved the desired thickness, the present embodiment proceeds to step 708. If dielectric layer 512 of semiconductor wafer 410 has substantially achieved the desired thickness, the present embodiment proceeds to step 714.

In step 714, CMP machine 400 of the present embodiment stops performing the chemical mechanical polishing process on dielectric layer 512 of semiconductor wafer 410, as described above.

Figure 8:
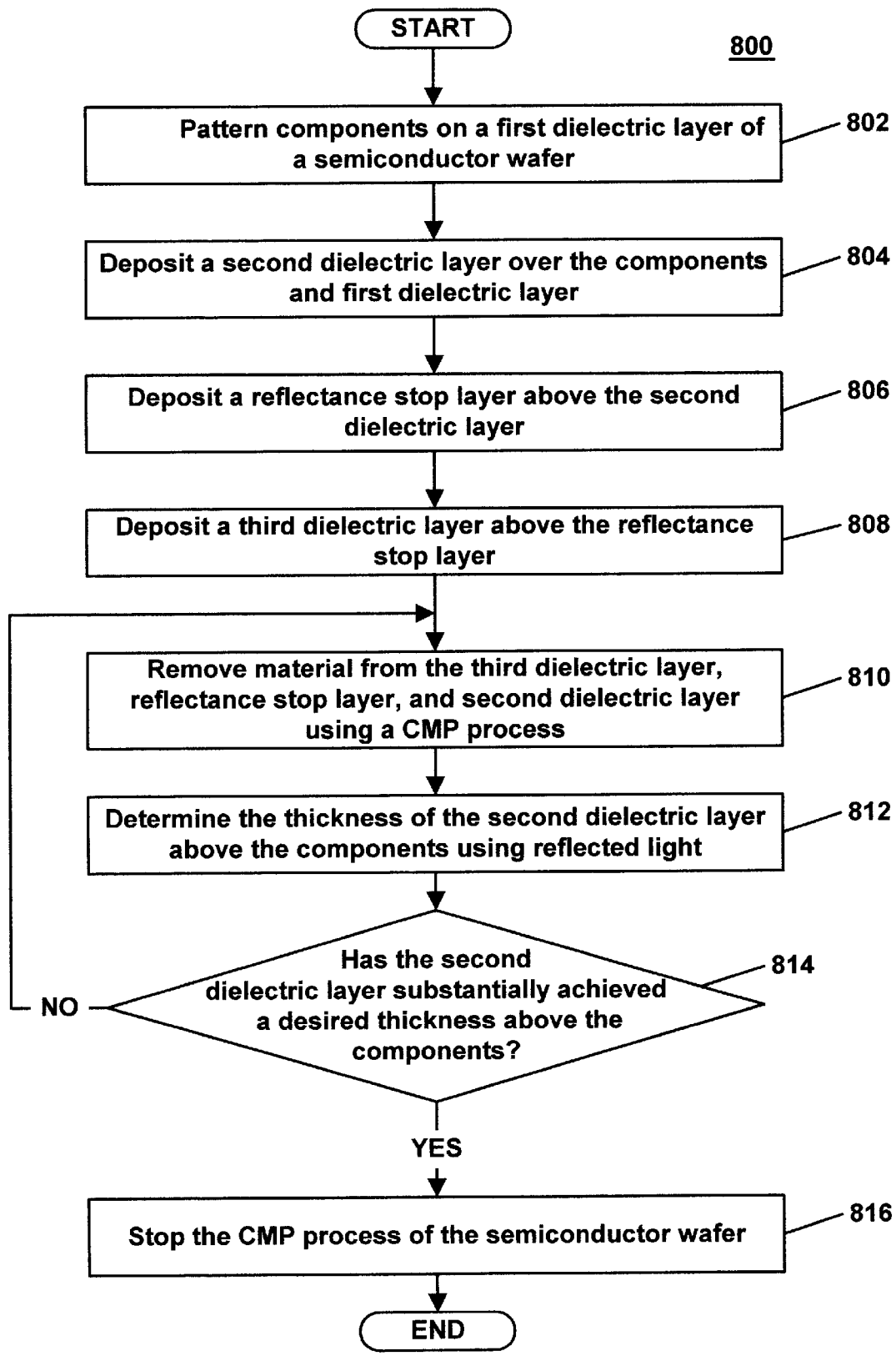
FIG. 8 is a flowchart of a method in accordance with another embodiment of the present invention for improving chemical mechanical polishing endpoint detection during planarization of semiconductor wafers.

With reference now to FIG. 8, a flowchart 800 in accordance with another embodiment of the present invention for providing more accurate endpoint detection during chemical mechanical polishing of semiconductor wafers. In step 802, in one embodiment of the present invention, components 608 and 610 of FIGS. 6A and 6B are patterned on dielectric layer 616 of semiconductor wafer 600. Within the present embodiment, it should be appreciated that during step 802, components 608 and 610 can be patterned on surfaces other than dielectric layer 616 (e.g., substrate 614).

Within step 804, dielectric layer 606 is deposited over dielectric layer 616 and components 608 and 610 of semiconductor wafer 600 of the present embodiment.

During step 806, within the present embodiment, reflectance stop layer 602 is deposited above dielectric layer 606 of semiconductor wafer 600.

Within step 808 of FIG. 8, dielectric layer 604 is deposited over reflectance stop layer 602 of semiconductor wafer 600.

In step 810, in the present embodiment, CMP machine 400 of FIGS. 4A and 4B removes material from dielectric layer 604, reflectance stop layer 602, and dielectric layer 606 by performing a chemical mechanical polishing process on semiconductor wafer 600, as described above.

Within step 812 of FIG. 8, the present embodiment determines the thickness of dielectric layer 606 above components 608 and 610 of semiconductor wafer 600 by using incident light during the CMP process, as described above. It should be appreciated that endpoint detection of the present embodiment is set to start determining the thickness of dielectric layer 606 once reflectance stop layer 602 has been polished away from above components 608 and 610 as shown in FIG. 6B.

During step 814, the present embodiment determines whether dielectric layer 606 of semiconductor wafer 600 has substantially achieved a desired thickness above components 608 and 610. If dielectric layer 606 of semiconductor wafer 600 has not substantially achieved the desired thickness above components 608 and 610, the present embodiment proceeds to step 810. If dielectric layer 606 of semiconductor wafer 600 has substantially achieved the desired thickness above components 608 and 610, the present embodiment proceeds to step 816.

In step 816, CMP machine 400 of the present embodiment stops performing the chemical mechanical polishing process on semiconductor wafer 600, as described above.

Thus, the present invention provides a method and system that provides more accurate endpoint detection during a CMP process of semiconductor wafers. As a result of the present invention, an operator of a CMP machine knows precisely when to stop a CMP process of a semiconductor wafer. Furthermore, the present invention enables the operator of the CMP machine to know within a certain accuracy the film (e.g., dielectric layer) thickness remaining after the CMP process of the semiconductor wafer. Moreover, the present invention essentially eliminates excessive chemical mechanical polishing of the semiconductor wafer. As such, not as much dielectric material needs to be deposited on the wafer in order to compensate for excessive chemical mechanical polishing of the semiconductor wafer. Therefore, the present invention is able to reduce fabrication costs of semiconductor wafers.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A method for improving chemical mechanical polishing endpoint detection during planarization of a semiconductor wafer, said method comprising the step of:
   (a) depositing a reflectance stop layer above a component disposed on a semiconductor wafer;
   (b) patterning said reflectance stop layer above said component disposed on said semiconductor wafer;
   (c) depositing a dielectric layer over said reflectance stop layer and said component;
   (d) removing material from said dielectric layer disposed above said semiconductor wafer using a chemical mechanical polishing process;
   (e) determining the thickness of said dielectric layer disposed above said semiconductor wafer using a reflected signal of light, wherein said reflectance stop layer substantially reduces any light from reflecting off of said component; and
   (f) in response to said dielectric layer substantially achieving a desired thickness, stopping said chemical mechanical polishing process of said semiconductor wafer.

2. A method for improving chemical mechanical polishing endpoint detection during planarization of a semiconductor wafer as described in claim 1 wherein said step (a) comprises:

depositing said reflectance stop layer above said component disposed on said semiconductor wafer, wherein said reflectance stop layer comprises a silicon oxy-nitride.

3. A method for improving chemical mechanical polishing endpoint detection during planarization of a semiconductor wafer as described in claim 1 wherein said step (a) comprises:

depositing said reflectance stop layer above said component disposed on said semiconductor wafer, wherein said reflectance stop layer comprises an amorphous silicon.

4. A method for improving chemical mechanical polishing endpoint detection during planarization of a semiconductor wafer as described in claim 1 wherein said step (a) comprises:

depositing said reflectance stop layer above said component disposed on said semiconductor wafer, wherein said component comprises a metal.

5. A method for improving chemical mechanical polishing endpoint detection during planarization of a semiconductor wafer as described in claim 1 wherein said step (c) comprises:

depositing said dielectric layer over said reflectance stop layer and said component, wherein said dielectric layer comprises an oxide.

6. A method for improving chemical mechanical polishing endpoint detection during planarization of a semiconductor wafer as described in claim 1 wherein said step (c) comprises:

depositing said dielectric layer over said reflectance stop layer and said component, wherein said dielectric layer comprises an oxide and said component comprises a metal.

7. A method for improving chemical mechanical polishing endpoint detection during planarization of a semiconductor wafer as described in claim 1 wherein said step (c) comprises:

depositing said dielectric layer over said reflectance stop layer and said component, wherein said dielectric layer comprises an oxide, said reflectance stop layer comprises a silicon oxy-nitride and said component comprises a metal.

8. A method for improving chemical mechanical polishing endpoint detection during planarization of a semiconductor wafer as described in claim 1 wherein said step (c) comprises:

depositing said dielectric layer over said reflectance stop layer and said component, wherein said dielectric layer comprises an oxide, said reflectance stop layer comprises an amorphous silicon and said component comprises a metal.

9. A method for improving chemical mechanical polishing endpoint detection during planarization of a semiconductor wafer, said method comprising the steps of:

(a) depositing a reflectance stop layer above a metal component disposed on a semiconductor wafer;

(b) patterning said reflectance stop layer above said metal component disposed on said semiconductor wafer;

(c) depositing a dielectric layer over said reflectance stop layer and said metal component disposed on said semiconductor wafer;

(d) removing material from said dielectric layer disposed above said semiconductor wafer using a chemical mechanical polishing process;

(e) determining the thickness of said dielectric layer disposed above said semiconductor wafer using a reflected signal of light, wherein said reflectance stop layer substantially reduces any light from reflecting off of said metal component; and (f) in response to said dielectric layer substantially achieving a desired thickness, stopping said chemical mechanical polishing process of said semiconductor wafer.

10. A method for improving chemical mechanical polishing endpoint detection during planarization of a semiconductor wafer as described in claim 9 wherein said step (a) comprises:

depositing said reflectance stop layer above said metal component, wherein said reflectance stop layer comprises a silicon oxy-nitride.

11. A method for improving chemical mechanical polishing endpoint detection during planarization of a semiconductor wafer as described in claim 9 wherein said step (a) comprises:

depositing said reflectance stop layer above said metal component, wherein said reflectance stop layer comprises an amorphous silicon.

12. A method for improving chemical mechanical polishing endpoint detection during planarization of a semiconductor wafer as described in claim 9 wherein said step (a) comprises:

depositing said reflectance stop layer above said metal component, wherein said metal component is aluminum, copper, silver, or gold.

13. A method for improving chemical mechanical polishing endpoint detection during planarization of a semiconductor wafer as described in claim 9 wherein said step (b) comprises:

depositing said dielectric layer over said reflectance stop layer and said metal component, wherein said dielectric layer comprises an oxide.

14. A method for improving chemical mechanical polishing endpoint detection during planarization of a semiconductor wafer, said method comprising the step of:

(a) depositing a first dielectric layer over a component disposed on a semiconductor wafer;

(b) depositing a reflectance stop layer above said first dielectric layer;

(c) depositing a second dielectric layer above said reflectance stop layer;

(d) removing material from said second dielectric layer and said reflectance stop layer disposed above said semiconductor wafer using a chemical mechanical polishing process, wherein said second dielectric layer and said reflectance stop layer subsequently are substantially removed from above said component;

(e) determining the thickness of said first dielectric layer above said component using a reflected signal of light, wherein said reflectance stop layer that remains substantially reduces any light from reflecting off of other surfaces except said component; and (f) in response to said first dielectric layer substantially achieving a desired thickness above said component, stopping said chemical mechanical polishing process of said semiconductor wafer.

15. A method for improving chemical mechanical polishing endpoint detection during planarization of a semiconductor wafer as described in claim 14 wherein said step (b) comprises:

depositing said reflectance stop layer above said first dielectric layer, wherein said reflectance stop layer comprises a silicon oxy-nitride.

16. A method for improving chemical mechanical polishing endpoint detection during planarization of a semiconductor wafer as described in claim 14 wherein said step (b) comprises:

depositing said reflectance stop layer above said first dielectric layer, wherein said reflectance stop layer comprises an amorphous silicon.

17. A method for improving chemical mechanical polishing endpoint detection during planarization of a semiconductor wafer as described in claim 14 wherein said step (a) comprises:

depositing said first dielectric layer over said component disposed on said semiconductor wafer, wherein said component comprises a metal.

18. A method for improving chemical mechanical polishing endpoint detection during planarization of a semiconductor wafer as described in claim 14 wherein said step (b) comprises:

depositing said reflectance stop layer above said first dielectric layer, wherein said first dielectric layer comprises an oxide.

19. A method for improving chemical mechanical polishing endpoint detection during planarization of a semiconductor wafer as described in claim 14 wherein said step (c) comprises:

depositing said second dielectric layer above said reflectance stop layer, wherein said second dielectric layer comprises an oxide.

20. A method for improving chemical mechanical polishing endpoint detection during planarization of a semiconductor wafer as described in claim 14 wherein said step (c) comprises:

depositing said second dielectric layer above said reflectance stop layer, wherein said first dielectric layer comprises an oxide and said second dielectric layer comprises an oxide.

21. A method for improving chemical mechanical polishing endpoint detection during planarization of a semiconductor wafer, said method comprising the steps of:

(a) depositing a first dielectric layer over a metal component disposed on a semiconductor wafer;

(b) depositing a reflectance stop layer above said first dielectric layer;

(c) depositing a second dielectric layer above said reflectance stop layer;

(d) removing material from said second dielectric layer and said reflectance stop layer disposed above said semiconductor wafer using a chemical mechanical polishing process, wherein said second dielectric layer and said reflectance stop layer subsequently are substantially removed from above said component;

(e) determining the thickness of said first dielectric layer above said metal component using a reflected signal of light, wherein said reflectance stop layer that remains substantially reduces any light from reflecting off of other surfaces except said metal component; and (f) in response to said first dielectric layer substantially achieving a desired thickness above said metal component, stopping said chemical mechanical polishing process of said semiconductor wafer.

22. A method for improving chemical mechanical polishing endpoint detection during planarization of a semiconductor wafer as described in claim 21 wherein said step (b) comprises:

depositing said reflectance stop layer above said first dielectric layer, wherein said reflectance stop layer comprises a silicon oxy-nitride.

23. A method for improving chemical mechanical polishing endpoint detection during planarization of a semiconductor wafer as described in claim 21 wherein said step (b) comprises:

depositing said reflectance stop layer above said first dielectric layer, wherein said reflectance stop layer comprises an amorphous silicon.

24. A method for improving chemical mechanical polishing endpoint detection during planarization of a semiconductor wafer as described in claim 21 wherein said step (a) comprises:

depositing said first dielectric layer over said metal component, wherein said metal component is aluminum, copper, silver, or gold.

25. A method for improving chemical mechanical polishing endpoint detection during planarization of a semiconductor wafer as described in claim 21 wherein said step (a) comprises:

depositing said first dielectric layer over said metal component, wherein said first dielectric layer comprises a polymer.

26. A method for improving chemical mechanical polishing endpoint detection during planarization of a semiconductor wafer as described in claim 21 wherein said step (c) comprises:

depositing said second dielectric layer above said reflectance stop layer, wherein said second dielectric layer comprises a polymer.

* * * * *